United States Patent [19]
Imai

[11] Patent Number: 5,901,050
[45] Date of Patent: May 4, 1999

[54] WIRED BASE PLATE AND PACKAGE FOR ELECTRONIC PARTS

[75] Inventor: Ryuji Imai, Nagoya, Japan

[73] Assignee: NGK Spark Plug Co., Ltd., Nagoya, Japan

[21] Appl. No.: 08/914,610

[22] Filed: Aug. 21, 1997

[30] Foreign Application Priority Data

Aug. 21, 1996 [JP] Japan .................................. 8-239718

[51] Int. Cl.$^6$ ...................................................... H05K 7/02
[52] U.S. Cl. ...................... 361/820; 361/748; 361/750; 361/751; 361/760; 361/767; 361/783; 361/784; 257/690; 257/692; 257/698; 257/700; 257/701; 257/704; 257/773; 257/774; 257/686
[58] Field of Search ..................... 361/820, 748, 361/750, 751, 760, 764, 767, 772, 774, 778, 783; 257/690, 692, 698, 700, 701, 704, 773, 774, 759

[56] References Cited

U.S. PATENT DOCUMENTS

| | | |
|---|---|---|
| 5,168,344 | 12/1992 | Ehlert et al. .............................. 257/693 |
| 5,230,759 | 7/1993 | Hiraiwa ..................................... 156/69 |
| 5,315,486 | 5/1994 | Fillion et al. ............................ 361/795 |
| 5,375,042 | 12/1994 | Arima et al. ............................ 361/784 |
| 5,635,767 | 6/1997 | Wenzel et al. .......................... 257/778 |

FOREIGN PATENT DOCUMENTS

| | | |
|---|---|---|
| 3-65674 | 10/1991 | Japan . |
| 7-13231 | 3/1995 | Japan . |
| 7-235768 | 9/1995 | Japan . |
| 8-167672 | 6/1996 | Japan . |

Primary Examiner—Leo P. Picard
Assistant Examiner—David Foster
Attorney, Agent, or Firm—Foley & Lardner

[57] ABSTRACT

In a wired base plate for an electronic part, an infinite number of metallic posts made of copper are provided to a lid joining section of a plural wire layer portion, which section includes a lid joining surface area to which a lid is joined. The metallic posts supports a pressure applied thereto from a lid at the time of mounting of the wired base plate on a circuit board and prevent the plural wire layer portion having a plurality of conductor wire layers and a plurality of resinous insulation layers, from being deformed by compression. A package for an electronic part having such a wired base plate is also provided.

10 Claims, 6 Drawing Sheets

5,901,050

WIRED BASE PLATE AND PACKAGE FOR ELECTRONIC PARTS

BACKGROUND OF THE INVENTION

1. Field of the Invention

The present invention relates in general to a wired base plate and package for electronic parts, and more particularly to a LGA (Land Grid Array) type wired base plate for mounting thereon an integrated circuit chip and an electronic part package having such an LGA type wired base plate on which an integrated circuit chip is mounted and which is hermetically sealed by means of a lid.

2. Description of the Related Art

Heretofore, a LGA type wired base plate for electronic parts (hereinafter referred to as LGA type wired base plate or simply as wired base plate) has been formed from high strength ceramic such as alumina by firing simultaneously with internal conductor wire layers and vias which are disposed inside the wired base plate. FIG. 8 shows an example of a prior art wired base plate 101. As shown, an electronic part 121 including an integrated circuit chip, transistor, capacitor and the like (hereinafter referred to simply as integrated circuit chip) is installed on the wired base plate 101 and electrically connected to same. A lid or cap 122 is bonded to the wired base plate 101 by soldering or the like, whereby an electronic part package 131 is completed.

In the meantime, such an electronic part package 131 is generally installed or mounted on a circuit board (exterior circuit board) in the following manner. For example, as shown in FIG. 9, a number of pads (connecting terminals) 105 formed on a lower or rear surface of the wired base plate 101 are brought into contact with respective pads 143 of a circuit board 142 by way of an intermediate connecting member (hereinafter referred to as a spring connector) 141 having a springy property, i.e., a resilience like a spring, and in such a state screw members 145 extending through a pushing plate 144 which is placed on the lid 122 and through the circuit board 142, are screwed into rear plates (metallic plate) 146 attached to a rear surface of the circuit board 142 and tightened with a predetermined torque to join them together. By such installation or mounting, the number of pads 105 on the rear surface of the wired base plate 101 and the number of pads 143 of the circuit board 142 are always brought into contact with each other under spring pressure to assure the electrical connection therebetween.

In the meantime, the spring connector 141 shown in FIG. 9 has an insulator in the form of a plate and made of rubber or flexible resinous material and a number of metal spring pieces having a bent shape (i.e. , like <). The bent metal spring pieces are disposed vertically and horizontally of the spring connector 141, i.e., at corresponding positions to the pads 105 and 143 so as to be resiliently deformable or compressed by the above pressure and brought into contact with the pads 105 and 143 under spring pressure. As will be understood from such a structure, in order to retain electrical connections between such a number of pairs of pads, it is indispensable for the both pads, i.e., a number of pairs of pads are pressed against each other with a considerable load. For example, a load necessary for such an end (hereinafter referred to simply as pressure or pushing pressure) is generally 50 to 100 g/pad (one contact point). Accordingly, in case of a wired base having 1000 pads, the wired base is always subjected to a load of from 50 to 100 Kg.

On the other hand, as the integrated circuit chip has come to operate at high speed, there may occur such a case in which a conventional wired base plate made of alumina ceramic cannot satisfy the requirements for its electrical characteristics such as impedance, capacitance, crosstalk and so on. Thus, to meet with such requirements for the high speed of the integrated circuit chip, a trial has been made to use such a wired base plate 201 shown in FIG. 10., i.e., a wired base plate including a substrate (single plate or laminated plate) 202 of ceramic such as alumina as a base, and a plural wire layer portion (multi-wire layer portion) 203 disposed on the substrate 202. The plural wire layer portion 203 includes a plurality of insulation layers of polyimide resin (hereinafter referred to simply as polyimide) or the like resin having a low dielectric constant as compared with alumina and a plurality of conductor wire layers which are laminated or placed alternately on upon another.

However, polyimide or the like resin is weak in the mechanical strength (compression) as compared with ceramic and furthermore considerably small in Young's modulus so it is easily deformed by compression. Thus, the LGA type wired base plate 201 formed in the above manner is subjected to a large pressure in case of installation or mounting on a circuit board as described above, there are caused the following problems. As shown in FIG. 11, an integrated circuit element 121 is mounted on such a wired base plate 201 and then a lid 122 is bonded or attached to the base plate 201 to complete a package. Thereafter, in mounting of the package on a circuit board, a pressure is applied to the package through the lid 122. When this is the case, all of the pressure is applied through the lid 122 to an outer peripheral part (i.e., lid bonding surface) of the plural wire layer portion 203.

Due to this, as shown in FIG. 11, the polyimide is caused to deform largely by the pressure P at or adjacent the surface area to which the lid 122 is bonded (i.e., the surface area indicated by the width W in the figure), so that a lid bonding section of the plural wire layer portion 203 is caused to sink or depressed relatively from an inner section of same by a deformation amount S. Such sinking or depressing, i.e., such deformation S by compression means that the plural wire layer portion 203 is always subjected to a shearing force at the border (i.e., the portion along the line K—K in FIG. 11) between the region (i.e., the region indicated by the width W) to which the lid 122 is bonded and the region to which the lid 122 is not bonded. Accordingly, the wired base plate 201 encounters a problem that there is a possibility of breakage or disconnection of the conductor wire layer 206 disposed inside the base plate 201 or the like defect being caused, i.e., a problem of being poor in the reliability in elongated period of usage.

Such a problem exists similarly even in case another resin is used in place of polyimide for an insulation resin layer constituting a plural wire layer portion so long as it is still deformed by compression similarly to polyimide by the force to which it is subjected at the time of the above described mounting. Further, it can be considered to use a glass epoxy resin or the like for a substrate in place of ceramic, but in this case the above problem exists entirely similarly.

SUMMARY OF THE INVENTION

According to an aspect of the present invention, there is provided a novel and improved wired base plate for an electronic part which comprises a substrate, a plural wire layer portion disposed on the substrate and having a plurality of resinous insulation layers and a plurality of conductor wire layers which are disposed by interposing therebetween the insulation layers, respectively, the plural wire layer portion having a lid joining section including a lid joining surface area to which a lid is joined, and pressure supporting means provided to at least the lid joining section for supporting a pressure which is applied to the plural wire layer portion by way of the lid.

By this aspect, the pressure supporting means is provided to at least the lid joining section of the plural wire layer portion for supporting the pressure applied to the plural wire layer portion, the pressure resulting when the wired base plate and a circuit board are pressed against each other by way of a lid while interposing between the pads thereof a spring connector at the time of mounting of the wired base plate on the circuit board, is supported by the pressure supporting means at the plural wire layer portion. Accordingly, compression deformation of the plural wire layer portion by the pressure applied thereto at the time of the above described mounting is prevented. As a result, the internal conductor wire layers are prevented from being subjected to an excessively large shearing force, thus making it possible to prevent breakage of the conductor wire layers.

It is preferable that the above described pressure supporting means are constituted by a plurality of metallic bodies (such metallic bodies that are higher in Young's modulus than the resinous insulation layers) such as metallic posts penetrating the plural wire layer portion in the thickness direction thereof. This is because the metallic bodies are higher in Young's modulus and harder to deform as compared with the resinous insulation layer and therefore can support the pressure with efficiency. Particularly, in case the metallic bodies are made of the same material with the vias penetrating the conductor wire layers and the resinous insulation layers and have a similar elongated structure to the vias, they can be formed by the same process with the conductor wire layers and the vias, so there is not required any additional process and the cost is not increased but they can be produced with efficiency.

Further, in case the metallic bodies are formed at the same time with the vias penetrating through the conductor wire layers and the resinous insulation layers, the metallic bodies similar in structure to the conductor wire layers and the vias can be produced without requiring an additional process.

According to a further aspect of the present invention, there is provided a package for electronic part, which comprises a wired base plate having a substrate and a plural wire layer portion disposed on the substrate and having a plurality of resinous insulation layers and a plurality of conductor wire layers which are disposed by interposing therebetween the resinous insulation layers, respectively, an electronic part disposed on the plural wire layer portion, and a lid joined to the plural wire layer portion of the wired base plate to hermetically seal the electronic part while pushing a lid joining surface area of the plural wire layer portion in the thickness direction thereof, the plural wire layer portion having, at a lid joining section thereof including the lid joining surface area, pressure supporting means for supporting the pressure applied thereto by the lid.

By this aspect, when the plural wire layer portion is pushed by a lid to subject a pushing force, the pushing force is supported by the pressure supporting means to prevent the resinous insulation layers from being deformed by compression. Accordingly, it becomes possible to prevent the inner conductor wire layers from being subjected to an excessively large shearing force and broken.

It is not inevitable for the pressure supporting means to be constituted by the metallic bodies, i.e., the material for the pressure supporting body is not limited to metal since the pressure supporting means or body will suffice if it can support most of the pressure (load) resulting when the plural wire layer portion is subjected to the pressure at the time of mounting of the wired base plate on a circuit board, to hold the resulting deformation of the resinous insulation layers lower than such an amount that does not cause breakage of the conductor wire layers.

The above structure is effective for solving the above noted problems inherent in the prior art device.

It is accordingly an object of the present invention to provide a novel and improved wired base plate for an electronic part which is free from the problem of occurrence of breakage of conductor wire layers at the time of its mounting on a circuit board and is highly reliable in operation over an elongated period of usage.

It is a further object of the present invention to provide a package for an electronic part which has a wired base plate of the foregoing character.

DETAILED DESCRIPTION OF THE PREFERRED EMBODIMENTS

Figure 1:
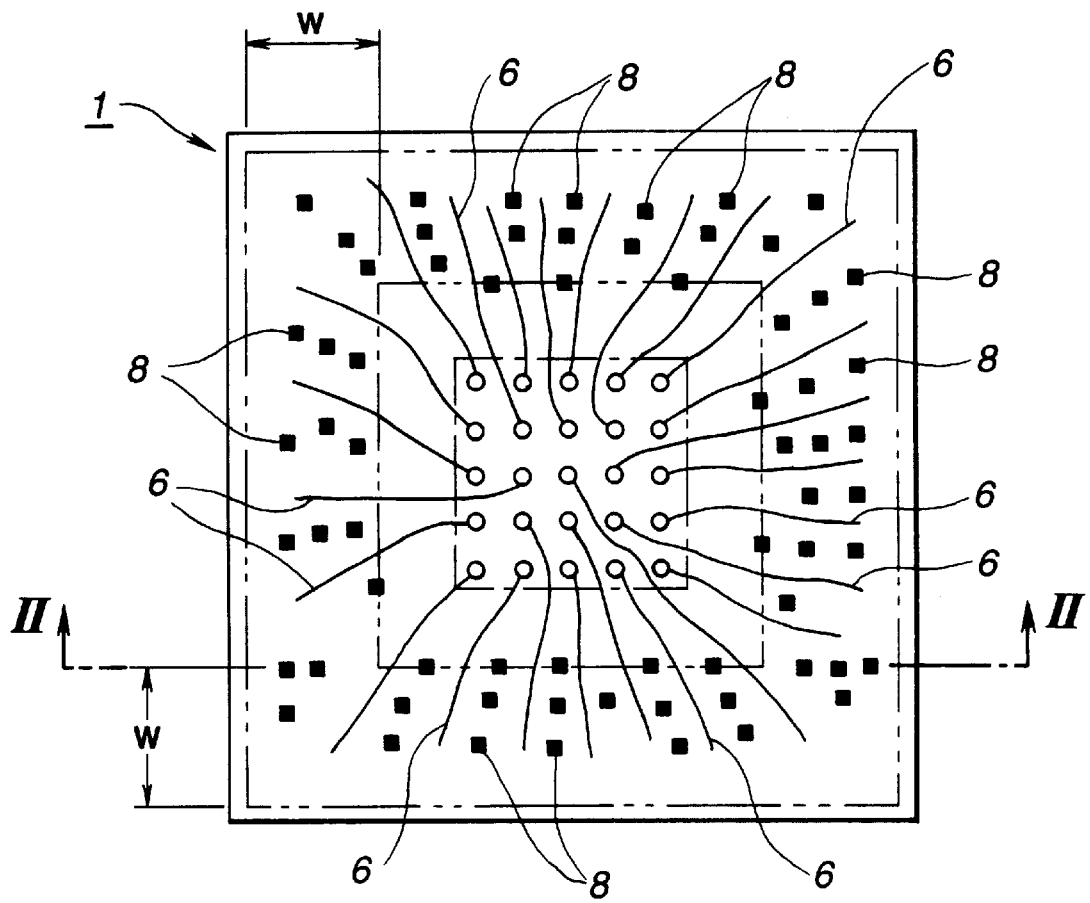
FIG. 1 is a sectional view taken along the line I—I of FIG. 2 and shows a LGA type wired base plate according to an embodiment of the present invention.
Figure 2:
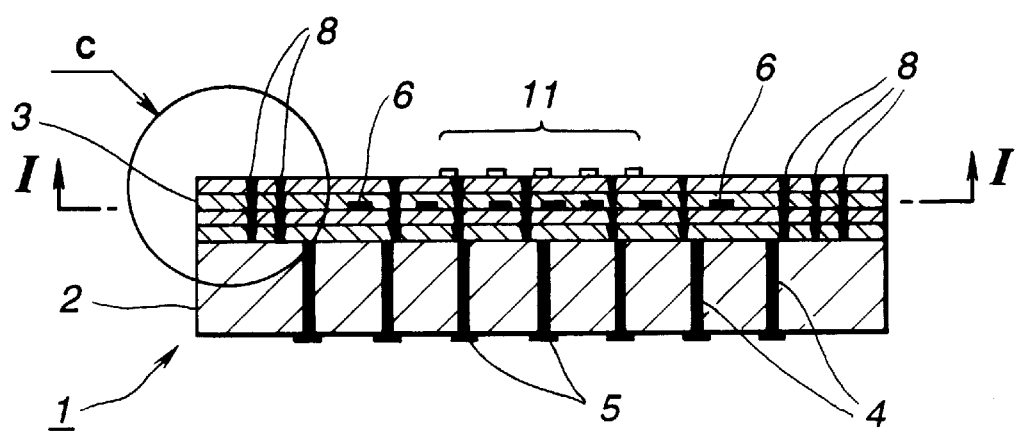
FIG. 2 is a sectional view taken along the line II—II of FIG. 1.
Figure 3:
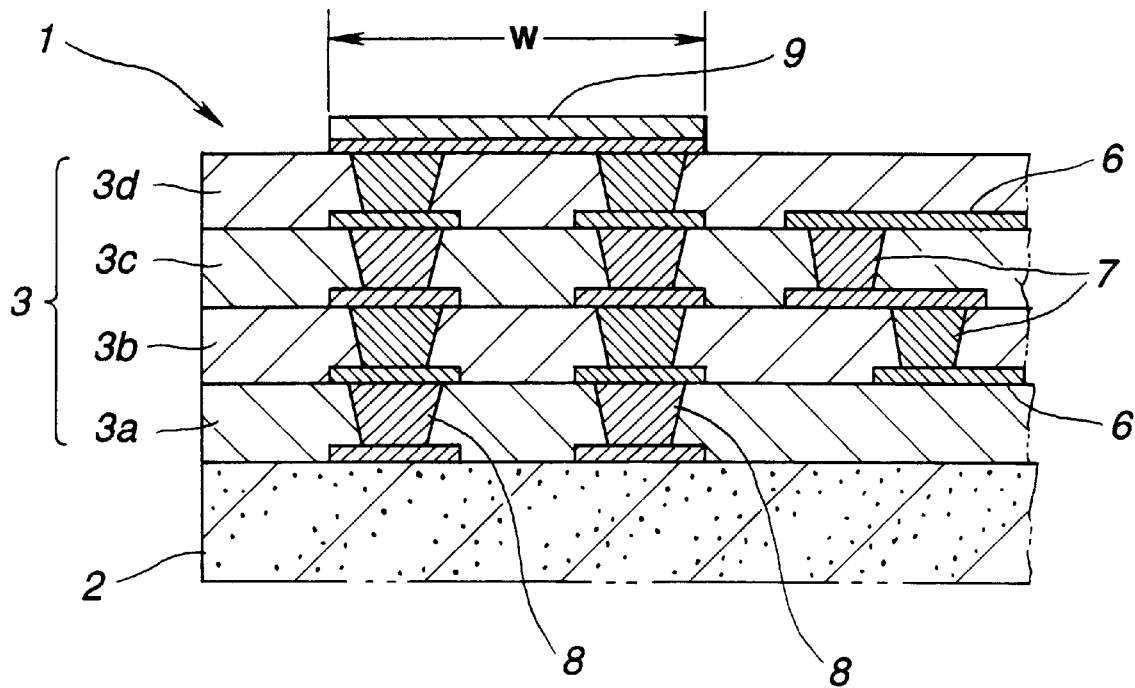
FIG. 3 is an enlarged view of a portion "C" of FIG. 2.

Referring first to FIGS. 1 to 3, a wired base plate for an electronic part according to an embodiment of the present invention will be described. In FIG. 1, a wired base plate according to an embodiment of the present invention is generally indicated by 1 and shown as being in the form of a nearly rectangular, thin plate when observed in a plan view.

The wired base plate 1 mainly consists of a ceramic substrate 2 of 1 mm thick, which constitutes a lower layer portion, and a plural wire layer portion 3 which constitutes an upper layer portion. In the ceramic substrate 2, there are formed, by simultaneous or concurrent firing with the ceramic base 2 (i.e., by the same firing with the ceramic substrate 2), a number of vias 4 for electrical conduction in a way as to penetrate the ceramic substrate 2 in the thickness direction. In the meantime, at the lower end portions of each vias 4, there are formed pads 5, respectively.

On the other hand, the plural wiring layer portion 3 includes, as shown in FIG. 3, a plurality of conductor wire layers 6 and a plurality of resinous insulation layers 3a to 3d made of polyimide resin or the like, which are alternately placed one upon another so as to be about 80 $\mu$m thick in total. In the meantime, in FIG. 3, indicated by the reference numeral 7 are vias for connection between the matching conduction wire layers 6, respectively. The conduction wire layers 6 are formed so as to have such an arrangement as shown in FIG. 1 ,when observed in a plan view, i.e., so as to have radially and irregularly elongated. shapes. At the outer peripheral portion of the wired base plate 1 when observed in a plan view, i.e., at a bonding area for bonding to a lid which will be described hereinlater (i.e., a rectangular frame-shaped area defined by rectangular two-dot chain lines in FIG. 1 and having the width W), there are disposed an infinite number of (i.e., so many) metallic posts 8 made of copper at the pitch of about 0.5 mm in vertical, horizontal and oblique directions so as to serve as a pressure supporting means in this embodiment while providing a required insulation distance with the associated conduction wire layers 6, in a way as to penetrate the plural wire layer portion 3 in the thickness direction thereof (refer to FIGS. 1 and 3).

However, as seen from FIG. 3, each metallic post 8 in this embodiment is nearly square in cross section and has such a shape constituted by a plurality of post sections which are tapered downward and a plurality of square plate sections which are alternately placed one upon another, i.e., having such a shape that repeats increase and decrease in diameter. Further, each metallic post 8 is formed so as to keep a required distance from the conductor wire layers 6 and the vias 7. The lid bonding area (the portion indicated by the width W in FIG. 3) of the surface of the plural wire layer portion 3 is formed with a metallized layer (copper-plated layer) 9 for brazing. Further, with additional reference to FIGS. 1 and 2, though not described in detail, at a central area of the surface of the plural wire layer portion 3, there are formed in this embodiment a number of bonding terminals (group of bonding terminals) 11 which are connected to the conductor wires 6, at a predetermined pitch in vertical and horizontal directions for bonding thereto an integrated circuit element by a flip-chip bonding technology.

Figure 4:
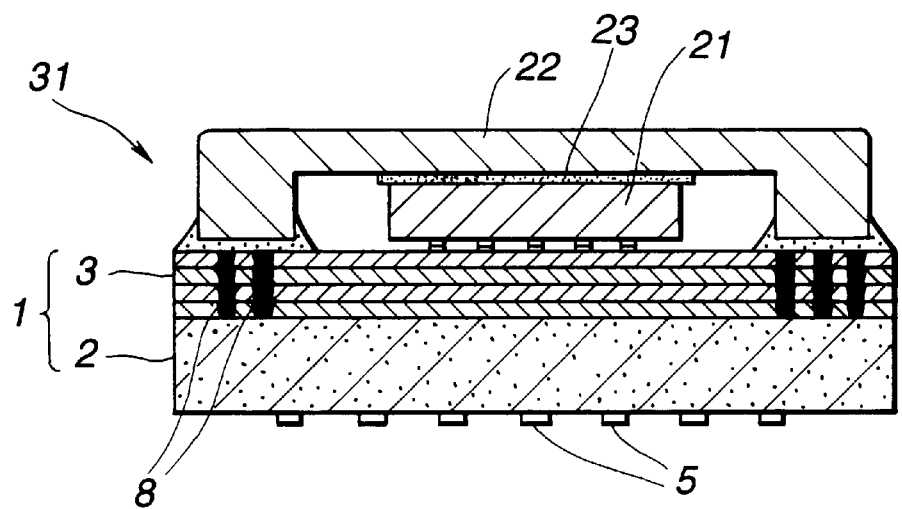
FIG. 4 is a sectional view of an integrated circuit package including the wired base plate of FIG. 1, together with an integrated circuit chip installed on the wired base plate.
Figure 5:
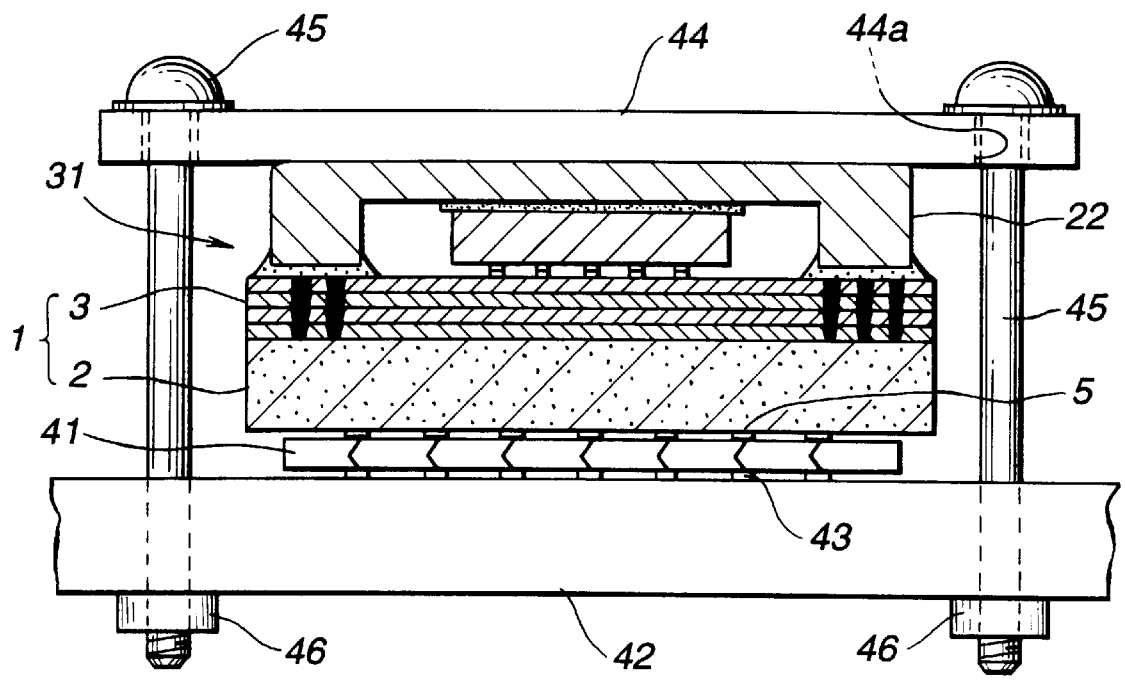
FIG. 5 is a sectional view of the package of FIG. 4 in a state of being mounted on a circuit board.

In the meantime, as shown in FIG. 4, to such a wired base plate 1 is connected an integrated circuit chip 21 in such a manner that the connecting terminals on the upper surface of the base plate 2 are matched with the respective connecting terminals of the integrated circuit chip 21. A lid 22 is disposed over the integrated circuit chip 21 so as to enclose the same and is soldered to the peripheral surface area (lid joining surface area indicated by the width W in FIG. 3) of the plural wire layer portion 3 of the wired base plate 1. An electronic part package 31 assembled in the above described manner is mounted on a circuit board in the same manner as the conventional. That is, as shown in FIG. 5, each pads 5 at the lower surface of the wired base plate 1 are aligned with each pads 43 of, for example, a circuit board (printed circuit board) made of glass epoxy resin by way of a spring connector 41, a pushing plate 44 prepared separately is placed on the lid 22, and screw members 45 inserted into screw mounting holes 44a of the pushing plate 44 are screwed into threaded holes of rear plates or nut members 46 attached to the rear side of the circuit board 42 and tightened with a predetermined torque. By always pushing the electronic part package 31 against the circuit board 42 with a predetermined force, electrical conduction between the pads 5 and 43 of the wired base plate 1 and the circuit board 42 are retained by way of the spring connector 41.

Figure 6:
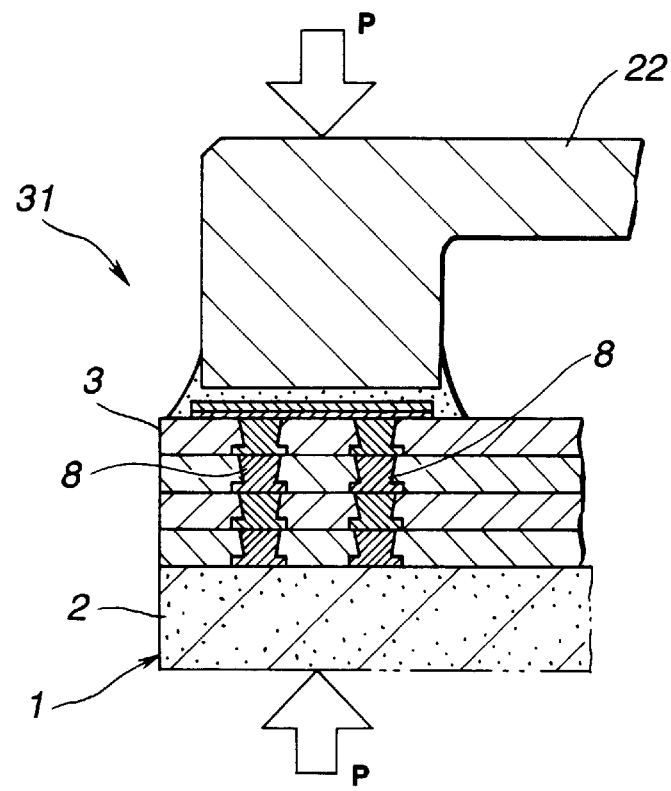
FIG. 6 is an enlarged fragmentary sectional view for illustration of the state in which a pressure supporting means provided to a plural wiring layer portion is subjected to a pressure.

In this instance, a relatively large pressure "P" is applied to the lid 22 joining surface area of the plural wire layer portion 3 similarly to the prior art wired base plate, such a pressure is supported, as shown in FIG. 6, by a number of (so many) metallic posts 8 which are provided at that surface, area and penetrate the plural wire layer portion 3 in the thickness direction thereof. That is, the plural wire layer portion 3 are sandwiched between the lid 22 and the ceramic substrate 2 serving as a base and subjected to a compression load P. However, since the metallic posts 8 are far larger in Young's modulus than the resinous insulation layers (polyimide layers) 3a–3d, so most of the compression load is supported by the metallic posts 8. Accordingly, there is not substantially caused compression deformation of the plural wire layer portion 3, i.e., the resinous insulation layers 3a–3d by the pressure applied thereto at the time of mounting of the package 31 to the circuit board 42, so there never occurs breakage of the conductor wire layers 6. In the meantime, in this embodiment, the pressure supporting means is constituted by the metallic posts 8 made of copper, so being capable of doubling as electrical wires for signal wiring and ground wiring. Indicated by the reference numeral 23 in FIG. 4 is a mass of thermal conductive grease interposed between the integral circuit chip 21 and the lid 22 for facilitating removal of heat from the integral circuit chip 21.

In the meantime, the metallic posts 8 which are formed in the plural wire layer portion (Cu—PI) made of polyimide or the like located on the ceramic substrate as a pressure supporting means, can be formed at the same time of forming of the plural wire layer portion 3, i.e., can be produced by the same process with the conductor wire layers 6 and the vias 7 for connection between the conductor wire layers 6. For producing the metallic posts 8 in the above described manner, which will be described more in detail hereinlater, it will do to alter the photomask pattern in the process of forming the plural wire layer portion 3, and there is not required any additional independent process, thus not increasing the cost. In the meantime, in case the substrate 2 is a ceramic substrate as described above, it can be formed by forming by a doctor blade technique a green sheet from a mixture of alumina powder or the ceramic powder and organic solvent or the like and firing the green sheet after a high melting point metallic paste such as molybdenum or tungsten is screen printed on the green sheet and the green sheet is formed with perforated holes in which metallic paste is filled. Further, in case the substrate 2 is of the type having a laminated structure, it can be formed by placing a predetermined number of such green sheets one upon another, compressing them to be joined together and firing them at the same time.

Then, with reference to FIG. 7 description will be made as to a preferable method of forming the above described metallic posts 8 at the same time when the plural wire layer portion 3 is formed on a main surface of a ceramic substrate 2 having been fired in the above manner and having surfaces finished by grinding is formed. Additional reference is made to FIGS. 1 to 3 where the conductor wire layers 6, vias 7 and metallic posts 8 are referred to since they are not shown in FIG. 7. That is, as shown in the step (A) of FIG. 7, a metallic thin film (e.g., Ti—Cu) 8a is formed by sputtering on a plural wire layer portion forming surface (upper surface) which is a main surface of the ceramic substrate 2, then a resist 51 is applied onto the metallic thin film 8a and its portions corresponding to the metallic posts 8 are processed by exposure and development similarly to its portions (not shown) corresponding to the conductor wire layers 6 and vias 7 (step (B) of FIG. 7), and those portions of the resist 51 are Cu-plated by an electroplating technology to form cover pads 8b constituting part of the metallic posts 8 at the same time with cover pads (not shown) of the conductor wire layers 6 and the vias 7 (step (C) of FIG. 7). In this instance, successively to the Cu-plating, Ni-plating may be made to form a thin Ni-plated layer on the Cu-plated layer. This is for the purpose of preventing the surfaces of the cover pads 8b and the conductor wire layers 6 from being etched in the etching process (step (F) of FIG. 7), which will be described hereinlater, for removing Cu of the metallic thin films 8a.

Figure 7:
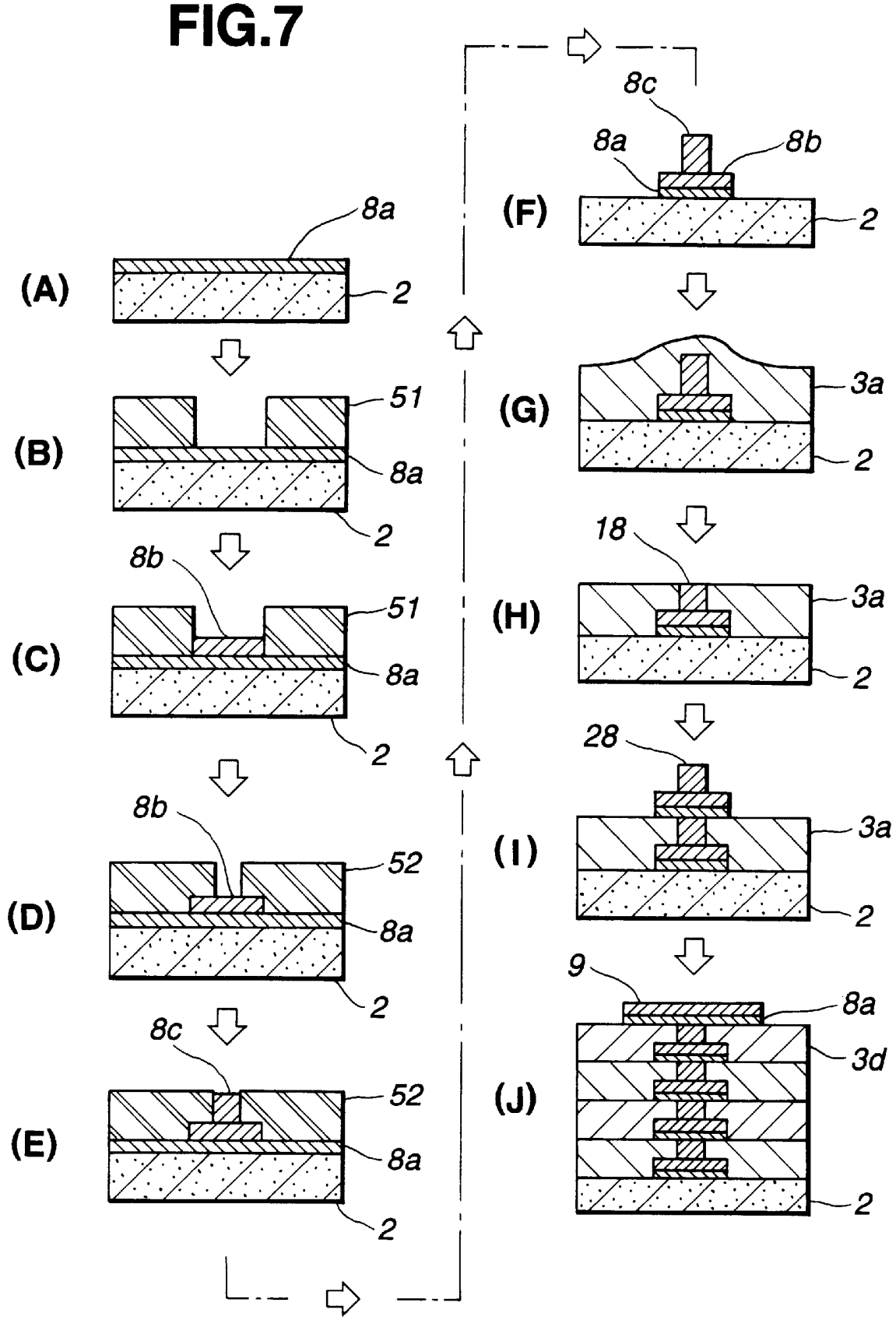
FIG. 7 is an illustration of process steps for forming a wired base plate and metallic posts.
Figure 8:
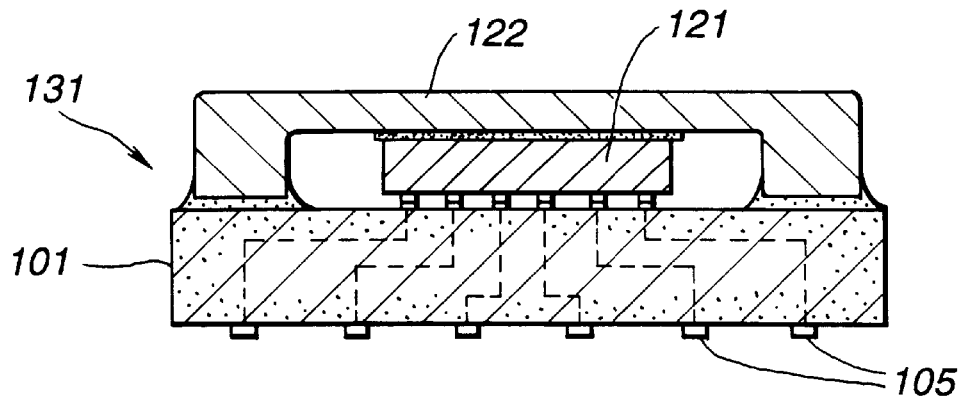
FIG. 8 is a sectional view of an integrated package including a prior art LGA type wired base plate, an integrated circuit chip mounted on the base plate and a lid bonded to the base plate.
Figure 9:
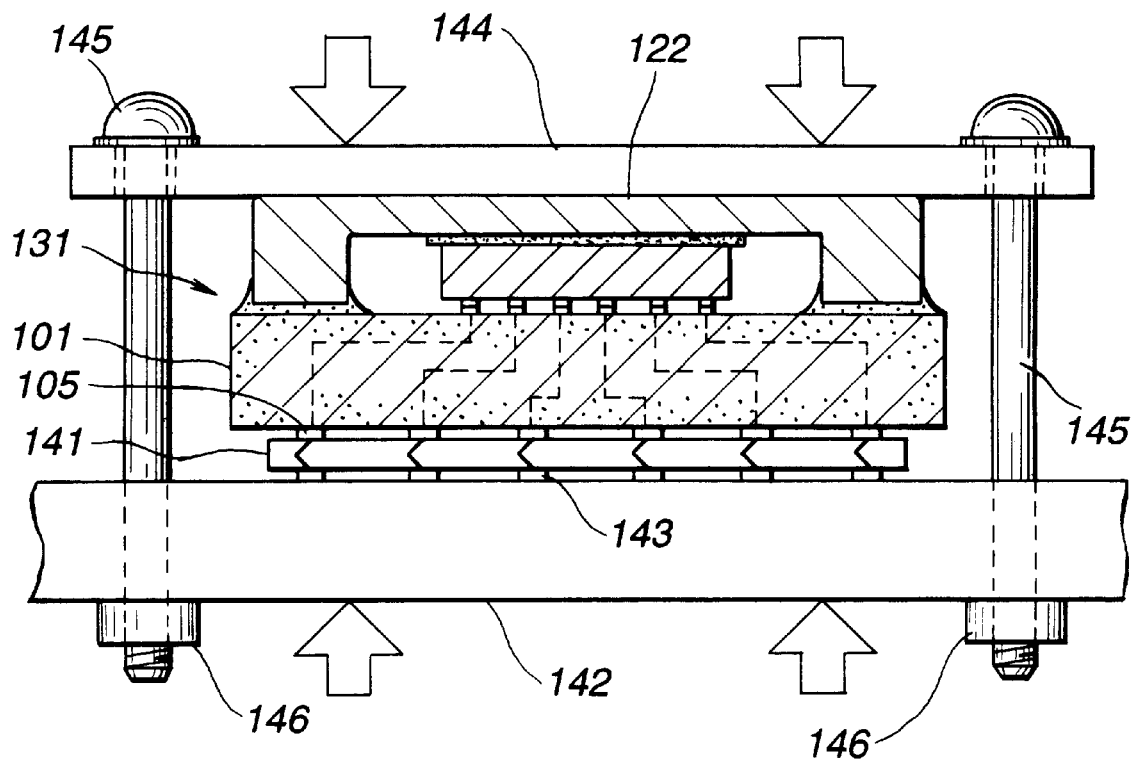
FIG. 9 is a sectional view of the package of FIG. 8 in a state of being mounted on a circuit board.
Figure 10:
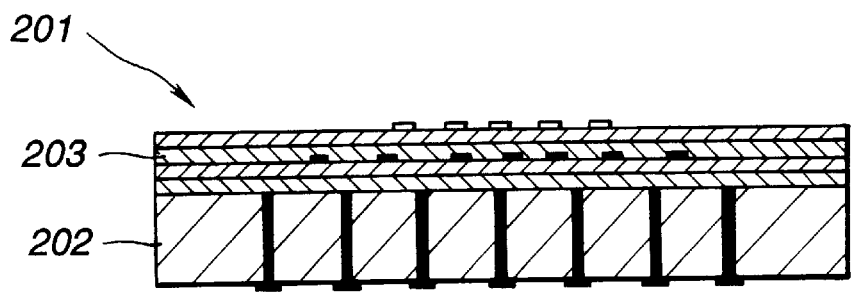
FIG. 10 is a sectional view of a prior art wired base plate having a substrate made of ceramic such as alumina, insulation layers of polyimide resin or the like, and conductor wire layers, the insulation layers and conductor wire layers being placed alternately on the substrate.

Then, the resist 51 is removed and a new resist 52 is applied again, portions of the resist 52 are processed by exposure and development so as to form openings through which upper surface central portions of the cover pads 8b open, similarly to portions (not shown) of the resist 52 for forming the vias 7 for connecting between the conductor wire layers 6 (step (D) of FIG. 7), and the opening portions of the resist 52 are processed by Cu-plating similarly to the process of forming the cover coppers 8b to form post-shaped portions 8c simultaneously with the vias 7 (not shown) (step (E) of FIG. 7). In the meantime, the reason why the resist 52 is herein applied again and then processed by exposure and development for Cu-plating, is for forming the metallic posts 8 by the same process with the vias 7 for connection between the conductor wire layers 6. Also in this plating process, it is desirable to process the opening portions by Ni-plating successively to the Cu-plating. This is for the purpose of protecting the upper surfaces of the post-shaped portions 8c and the vias 7 in the etching process (step (F) of FIG. 7) which will be described hereinlater. By so doing, the metallic posts 8 are made of the same material with the vias 7 and structured in a height direction thereof similarly to the vias 7, i.e., the metallic posts 8 have a similar elongated shape and structure to the vias 7. The resist 52 is removed again and an unnecessary portion of the sputtered metallic thin film 8a is removed by etching (step (F) of FIG. 7). Thereafter, a polyimide layer 3a is applied over the upper surface of the substrate 2 including the cover pads 8b, post-shaped portions 8c, etc. and cured (step (G) of FIG. 7), and then the surface of the polyimide layer 3a is flattened by grinding (step (H) of FIG. 7). Thus, the first wire layer is formed simultaneously with metallic post portions 18 for that wire layer. In the meantime, in case Ni-plating in succession to Cu-plating is made in the process of plating the post-shaped portions 8c shown in the step (E) of FIG. 7, the Ni-plated portion is removed by grinding.

Figure 11:
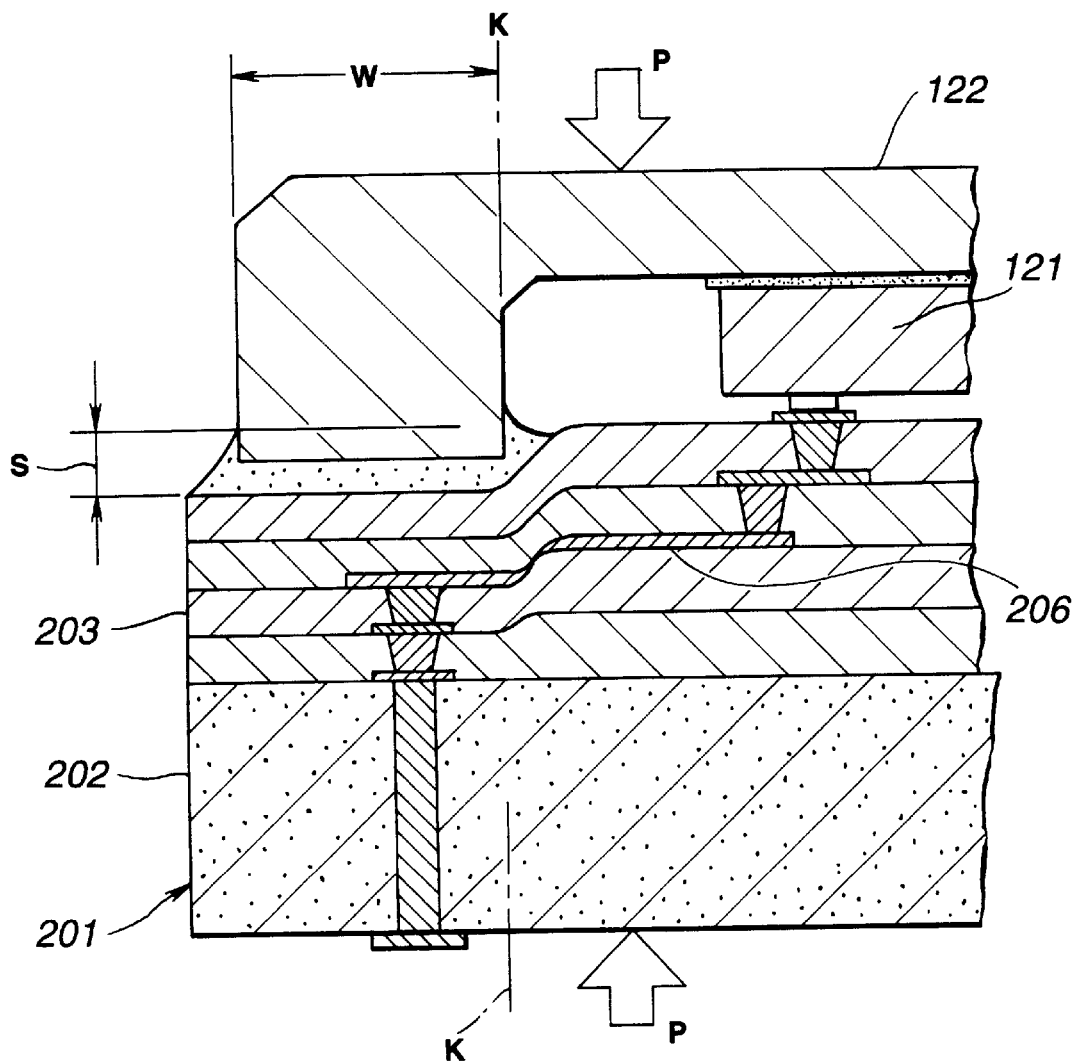
FIG. 11 is an illustration of a state of a plural wiring layer portion being deformed by compression in case a wired base plate having on a ceramic substrate the plural wiring layer portion consisting of conductor wire layers and insulation layers of polyimide or the like insulation resin which are installed alternately on the ceramic substrate.

From the step (A) of FIG. 7 onward, sputtering of Ti—Cu over the surface of the first polyimide layer 3a is first made and then the steps (A) to (F) of FIG. 7 are repeated to place metallic post portions 28 for the second layer on the metallic post portions 18 (step (I) of FIG. 7). The steps (G) to (H) of FIG. 7 are then repeated to form the second wire layer. Further, those process steps are repeated a predetermined number of times, and a metallic thin film (Ti—Cu) 8a is formed on the last or uppermost polyimide layer 3d by sputtering and is processed by etching to form a metallic layer only on a predetermined surface area (lid bonding or joining surface area), on which metallic layer is formed a Cu-plated layer 9 (step (J) of FIG. 7). The surfaces of pads and so on are Ni-plated and Au-plated for prevention of corrosion and the like, whereby the wired base plate 1 having conductor wire layers and vias (not shown and further having the infinite number of metallic posts 8 is completed. Thus, according to the method of this invention, the metallic posts 8 can be formed by the same process with the conventional plural wire layer portion 203 (refer to FIG. 11) except for only alteration of the photomask pattern, thus not increasing the cost.

In the meantime, the metallic posts 8 are shaped so as to taper downward as best seen from FIG. 3 but may be shaped so as to be cylindrical as shown in the step (J) of FIG. 7 or may be shaped so as to taper reversely according to the photoresist exposing and developing conditions, i.e., a suitable shape may be selected according to the manufacturing conditions. In the meantime, it is desirable for the pressure supporting means provided to the plural wire layer portion 3 to be designed, in addition to such shaped of the metallic posts 8 as described above, so as not to cause any obstacle to arrangement of the conductor wire layers 6 while being capable of preventing compression deformation of the insulation resin layers 3a to 3d constituting the plural wire layer portion 3, due to the pressure at the time of mounting of the package on a circuit board, i.e., the metallic posts 8 are arranged in an array of a suitable shape such as a square or circular array when observed in a plan view and in a way so as to be suitable in number, area for their arrangement and pitch, and at least within an area with which the lid is brought into contact.

In case of forming the metallic posts by the above described method, the metallic posts are made of the same material with the conductor wire layers. However, the present invention is not limited to it. That is, the pressure supporting means of the present invention is disposed at least at the area of the plural wire layer portion to which the lid is attached, so the pressure supporting means will suffice if the thickness of the plural wire layer portion is varied due to compression deformation thereof to such an extent as to cause a defect such as breakage of the conductor wire layers or the like. Thus, design of the pressure supporting means on its material and the like can be modified variously without departing from the scope of the present invention. Further, while the lid 22 has been described and shown by way of example in the foregoing as being soldered to the plural wire layer portion 3, it may be bonded thereto by adhesive such as epoxy resin, etc. In the meantime, in case of bonding by adhesive, the metal thin film, Cu-plated layer 9 and the like provided to the lid bonding area of the surface of the polyimide layer 3d can be dispensed with. This is because bonding by adhesive can be attained without the Cu-plated layer.

In the meantime, the pressure supporting means made up of metallic posts or the like metallic bodies as described above, can be provided only for support of pressure (support of load), but can double as electrical connections for the signal wiring and ground wiring. Further, it will be apparent that even in the case the resin forming the insulation layers of the plural wire layer portion is not polyimide but another resin which is easily deformed by compression, substantially the same effect can be attained according to the present invention. Further, while the substrate (base) of the wired base plate is made of ceramic, it can be made of, in place of ceramic, a resin such as glass epoxy resin to produce substantially the same effect of the present invention. Further, the above described LGA type wired base plate has been described as being of such one on which an integrated circuit chip is mounted by a flip chip technology but otherwise can be of such one for a wire bonding technology.

[Example]

Twenty examples of wired base plates according to the present invention were produced by the above described method and under the following conditions, lids were bonded to the base plates to constitute packages, the packages were mounted on circuit board in the same manner as the conventional, and the rate of occurrence of breakage of the conductor wire layers were observed or confirmed. In the meantime, each example is of such one, i.e., the substrate is made of ceramic, 40 nm square and 1.0 mm thick and the pads on the rear surface of the substrate are arranged at the pitch of 1.0 mm and about 1400 in number. The plural wire layer portion formed on the substrate is of such one, i.e., the conductor wire layers are five in number, the polyimide layers are five in number, each conductor wire layer is 25 $\mu$m wide, each conductor wire layer is 5 $\mu$m thick, the plural wire layer portion is about 150 $\mu$m thick in total, and the outer periphery of the lid bonding area is 40 mm square and the inner periphery of same is 20 mm square so that the width of the lid bonding area is 10 mm. In the meantime, the cross section of each metallic post is 50 $\mu$m square in average, and the metallic posts are arranged at the pitch of 0.5 mm and about 4000 in number. The pressure P at the time of mounting is 100 Kg (i.e., 25 g per one metallic post). By the mounting test conducted, it was found that the rate of occurrence of breakage of the conductor wire layers with respect to the examples of this invention was 0%. In contrast to this, the rate of occurrence of breakage with respect to the comparative examples which are not provided with such metallic posts was 20%.

From the foregoing, it will be understood that since a LGA type wired base plate of this invention has a pressure supporting means at a plural wire layer portion thereof to which a pressure is applied at the time of mounting on a circuit board, the pressure applied by way of a spring connector to each pads of the wired base plate and the circuit board is mainly supported not by the resinous insulation layer but by the pressure supporting means. Accordingly, the pressure receiving area of the plural wire layer portion is prevented from being deformed by compression, thus making it possible to prevent occurrence of breakage of a conductor wire layer within the plural wire layer portion or the like fatal defect and improve the reliability.

In case the pressure supporting means is constituted by a plurality of metal bodies penetrating the plural wire layer portion in the thickness direction thereof, it is harder to deform as compared with the resinous insulation layer, thus being capable of supporting the pressure with efficiency and further doubling as electric wires for signal wiring and ground wiring. Further, in case the metallic bodies are formed of the same material and the structure with the vias which penetrate through the resinous insulation layers, they can be formed simultaneously and by the same process with the vias, thus making it possible to realize the present invention without requiring an additional independent process and increasing the cost.

What is claimed is:

1. A wired base plate for an electronic part comprising:
    a substrate;
    a plural wire layer portion disposed on said substrate and having a plurality of resinous insulation layers and a plurality of conductor wire layers which are disposed by interposing therebetween said resinous insulation layers, respectively;
    said plural wire layer portion having a lid joining peripheral section including a lid joining surface area to which a lid is joined; and
    pressure supporting means disposed in said lid joining section for supporting a pressure applied to said lid joining peripheral section by way of the lid;
    wherein said pressure supporting means includes a plurality of metallic bodies which are formed in said insulation layers, respectively, and which are axially aligned with each other to constitute an axially straight, integral post which penetrates said plural wire layer portion throughout the thickness thereof.

2. A wired base plate according to claim 1, further comprising a plurality of vias connecting between adjacent two of said conductor wire layers, respectively, said metallic bodies being made of the same material with said vias and structured in a height direction thereof similarly to said vias.

3. A wired base plate according to claim 1, wherein said metallic bodies are formed simultaneously with said vias.

4. A wired base plate according to claim 1, wherein said metallic bodies constitute part of a signal wiring.

5. A wired base plate according to claim 1, wherein said metallic bodies constitute part of a ground wiring.

6. A package for an electronic part comprising:
    a wired base plate having a substrate and a plural wire layer portion disposed on said substrate and having a plurality of resinous insulation layers and a plurality of conductor wire layers which are formed by interposing therebetween said resinous insulation layers, respectively;
    an electronic part disposed on said plural wire layer portion; and
    a lid joined to said plural wire layer portion of said wired base plate to hermetically seal said electronic part while pushing a lid joining surface area of said plural wire layer portion in the thickness direction thereof;
    said plural wire layer portion having a lid joining peripheral section having said lid joining surface area, and pressure supporting means disposed in said lid joining peripheral section for supporting said pressure applied to said lid joining peripheral section by said lid;
    wherein said pressure supporting means includes a plurality of metallic bodies which are formed in said insulation layers, respectively, and which are axially aligned with each other to constitute an axially straight, integral post which penetrates said plural wire layer portion throughout the thickness thereof.

7. A package according to claim 6, further comprising a plurality of vias connecting between adjacent two of said conductor wire layers, respectively, said metallic bodies being made of the same material with said vias and structured in a height direction thereof similarly to said vias.

8. A wired base plate according to claim 6, wherein said metallic bodies are formed simultaneously with said vias.

9. A wired base plate according to claim 6, wherein said metallic bodies constitute part of a signal wiring.

10. A wired base plate according to claim 6, wherein said metallic bodies constitute part of a ground wiring.

* * * * *